(12) United States Patent
Varanasi et al.

(10) Patent No.: US 9,697,892 B1
(45) Date of Patent: Jul. 4, 2017

(54) GENERATION AND APPLICATION OF GRAY CODES

(71) Applicant: Micron Technology, Inc., Boise, ID (US)

(72) Inventors: Chandra C. Varanasi, Broomfield, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/284,666

(22) Filed: Oct. 4, 2016

(51) Int. Cl.
| | | |
|---|---|---|
| *G11C 7/00* | (2006.01) | |
| *G11C 11/56* | (2006.01) | |
| *G06F 11/10* | (2006.01) | |
| *G11C 29/52* | (2006.01) | |
| *H03K 23/00* | (2006.01) | |
| *H03M 7/16* | (2006.01) | |

(52) U.S. Cl.
CPC ...... *G11C 11/5628* (2013.01); *G06F 11/1068* (2013.01); *G11C 11/5635* (2013.01); *G11C 29/52* (2013.01); *H03K 23/005* (2013.01); *H03M 7/16* (2013.01)

(58) Field of Classification Search
CPC . G11C 11/5628; G11C 11/5635; G11C 29/52; G06F 11/068; H03K 23/005; H03M 7/16
USPC ............ 365/185.03, 129, 174, 189.011, 191, 365/233.16, 233.17, 244
See application file for complete search history.

(56) References Cited

U.S. PATENT DOCUMENTS

| | | | |
|---|---|---|---|
| 4,780,894 A | 10/1988 | Watkins et al. | |
| 6,304,398 B1 | 10/2001 | Gaub et al. | |
| 7,019,673 B2 * | 3/2006 | Blaum ................... | H03M 7/16 341/106 |
| 7,710,676 B1 | 5/2010 | Chue | |

* cited by examiner

*Primary Examiner* — Fernando Hidalgo
(74) *Attorney, Agent, or Firm* — Brooks, Cameron & Huebsch, PLLC

(57) ABSTRACT

The present disclosure includes apparatuses, methods, and non-transitory computer-readable storage mediums for generation and application of gray codes. One example method comprises: selecting a particular N-bit member as a root member for a plurality of N-bit gray codes each comprising X members such that each of the plurality of N-bit gray codes comprise a same root member; and generating X−1 remaining members of the respective plurality of N-bit gray codes by performing X−1 member generation iterations, wherein each $i^{th}$ iteration of the X−1 member generation iterations generates respective $i^{th}$ members of the plurality of N-bit gray codes based on $i^{th}-1$ members, with each one of the respective $i^{th}$ members comprising only those eligible neighbor members of a respective one of the $i^{th}-1$ members, and with "i" being a whole number index from 1 to X−1.

30 Claims, 8 Drawing Sheets

GENERATION AND APPLICATION OF GRAY CODES

TECHNICAL FIELD

The present disclosure relates generally to semiconductor memory apparatuses, methods, and non-transitory computer-readable storage media, and more particularly, to generation and application of gray codes.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption, relative to various other memory devices.

Memory cells in an array architecture can be programmed to a target (e.g., desired) state. For instance, electric charge can be placed on or removed from the charge storage structure (e.g., floating gate) of a flash memory cell to program the cell to a particular data state. The stored charge on the charge storage structure of the memory cell can indicate a threshold voltage (Vt) of the cell.

A memory cell programmable to two different states may be referred to as a single level cell (SLC), and a memory cell programmable to more than two states may be referred to as multilevel cells (MLCs), multistate cells, and/or multiunit cells. As an example, a flash SLC is programmable to a targeted one of two different Vt levels corresponding to two respective data states such that it stores a single bit of data (e.g., binary "1" or "0"). MLC flash memory cells are programmable to a targeted one of more than two different Vt levels corresponding to more than two respective data states such that they can store more than a single bit of data per cell. For instance, some MLC cells can store 4 bits per cell with the cells being programmable to sixteen different data states, which can be assigned different respective 4-bit binary values (e.g., 0000, 0001, 0010, 0011, 0100, 0101, 0110, 0111, 1000, 1001, 1010, 1011, 1100, 1101, and 1111) The binary encoding of the different states (e.g., the particular assignments of binary values to respective states is variable. For instance, a gray code may be used such that the binary values assigned to two successive (e.g., neighbor) states differ in only one bit. One example of a 4-bit gray code is (1111, 0111, 0011, 1011, 1001, 0001, 0101, 1101, 1100, 0100, 0000, 1000, 1010, 0010, 0110, and 1110).

DETAILED DESCRIPTION

Figure 1:
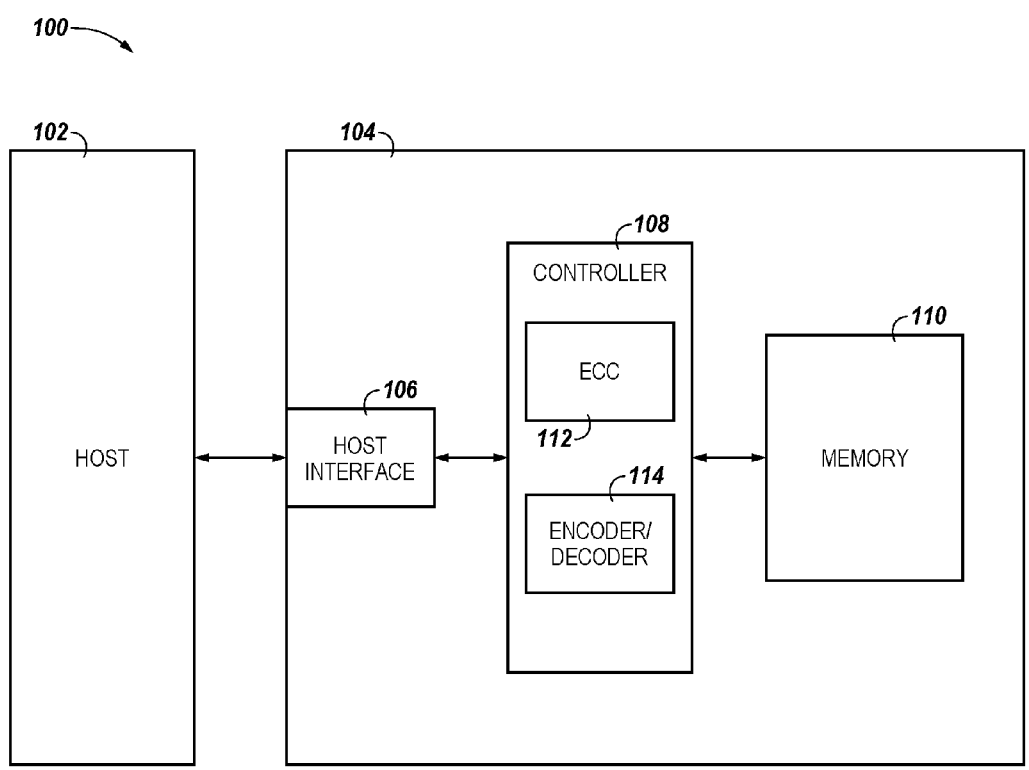
FIG. 1 is a block diagram of an apparatus in the form of a computing system including a memory system comprising memory cells configured to store data in accordance with a selected gray code determined in accordance with a number of embodiments of the present disclosure.

The present disclosure includes apparatuses, methods, and non-transitory computer-readable storage media associated with generation and application of gray codes. One example method comprises: selecting a particular N-bit member as a root member for a plurality of N-bit gray codes each comprising X members such that each of the plurality of N-bit gray codes comprise a same root member; and generating X−1 remaining members of the respective plurality of N-bit gray codes by performing X−1 member generation iterations, wherein each $i^{th}$ iteration of the X−1 member generation iterations generates respective $i^{th}$ members of the plurality of N-bit gray codes based on $i^{th}-1$ members, with each one of the respective $i^{th}$ members comprising only those eligible neighbor members of a respective one of the $i^{th}-1$ members, and with "i" being a whole number index from 1 to X−1.

Embodiments of the present disclosure can provide benefits such as providing improved methods for enumerating gray codes that satisfy a particular characteristic as compared to previous gray code enumeration processes. For instance, various embodiments can reduce the quantity of iterations used to determine all possible N-bit gray codes from a list of $2^N$ possible binary N-tuples, where "N" is a positive whole number (e.g., 1, 2, 3, 4, etc.), as compared to previous approaches.

A number of embodiments can provide memory cells encoded in accordance with a selected gray code in order to achieve a particular characteristic. For example, a particular gray code can be selected to achieve an improved error rate (e.g., bit error rate) and/or a more uniform read time associated with reading bits corresponding to different pages stored in a same memory cell, as compared to error rates and/or read times associated with other gray code assignments. As an example, consider a group (e.g., a row) of MLCs encoded with a 4-bit gray code (e.g., N=4) such that each stores four bits corresponding to four respective different logical pages of data. Assuming the MLCs are programmable to 16 states (e.g., $2^N$=16), determining a particular one of the 16 states to which a respective cell is programmed requires 15 (e.g., $2^N$-1) read strobes. However, the quantity of read strobes required to decode the respective bits can vary depending on the particular gray code with which the states are encoded as well as depending on which page is being read. For example, cells encoded in accordance with one particular gray code might require a single strobe to decode the bit corresponding to the first page (e.g., a lower page), two strobes to decode the bit corresponding to the second page (e.g., first middle page), four strobes to decode the bit corresponding to the third page (e.g., second middle page), and eight strobes to decode the bit corresponding to the fourth page (e.g., the upper page). Accordingly, reading the first page using a single strobe can be considered a "fast" read and reading the fourth page can be considered a "slow" read since reading the first page requires eight times as many strobes (e.g., threshold voltage detection operations) as reading the fourth page. As another example, 4-bit cells encoded in accordance with a different particular gray code might require seven strobes to read the first page, two strobes to read the second page, four strobes to read the third page, and two strobes to read the fourth page.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M" and "N", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense. Also, although examples described herein involve gray code assignments to NAND memory cell states, embodiments are not so limited. For instance, embodiments of the present disclosure can be applied to gray code assignments to various other memory technologies as well as to various other technologies such as digital communications, among others.

FIG. 1 is a block diagram of an apparatus in the form of a computing system 100 including a memory system 104 comprising memory cells configured to store data in accordance with a selected gray code determined in accordance with a number of embodiments of the present disclosure.

As used herein, a memory system 104, a controller 108, or a memory device 110 might also be separately considered an "apparatus." The memory system 104 can be a solid state drive (SSD), for instance, and can include a host interface 106, a controller 108 (e.g., a sequencer and/or other control circuitry), and memory 110 (e.g., a number of memory devices 110. The memory 110 can comprise, for instance, a number of solid state memory devices such as NAND flash devices, which provide a storage volume for the memory system 104.

The controller 108 can be coupled to the host interface 106 and to the memory 110 via a plurality of channels and can be used to transfer data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors).

The controller 108 can communicate with the memory 110 (which in some embodiments can be a number of memory arrays on a single die) to control data read, write, and erase operations, among other operations. As an example, the controller 108 can be on a same die or a different die than a die or dice corresponding to memory 110.

Although not specifically illustrated, the controller 108 can include a discrete memory channel controller for each channel coupling the controller 108 to the memory 110. The controller 108 can include, for example, a number of components in the form of hardware and/or firmware (e.g., one or more integrated circuits) and/or software for controlling access to the memory 110 and/or for facilitating data transfer between the host 102 and memory 110.

As illustrated in FIG. 1, the controller 108 can include an error correction code (ECC) component 112 (shown as "ECC") and an encoder/decoder component 114 (shown as "ENCODER/DECODER). The component 112 can include, for example, an algebraic error correction circuit such as one of the group including a Bose-Chaudhuri-Hocquenghem (BCH) error correction circuit and a Reed-Solomon error correction circuit, among other types of error correction circuits. The component 112 is not limited to circuitry (e.g., hardware) implementations. For instance, the component 112 can be implemented in hardware, firmware, and/or software. Also, component 112 is not limited to a particular type of error correction scheme. For example, component 112 can be an LDPC component, among various other types of ECC components. Although referred to as an error correction component, component 112 can be used to detect, as well as to correct, data errors.

The component 114 can include, for example, circuitry configured to encode and/or decode a plurality of data states, as described further herein. For instance, the component 114 can encode the plurality of data states to which memory cells are programmable in accordance with a selected N-bit gray code. As an example, the component 114 can be configured to encode each one of the plurality of data states with a respective member of the selected N-bit gray code in association with writing data to memory 110, and can be configured to decode the data in association with reading from memory 110. The component 114 is not limited to circuitry (e.g., hardware) implementations. For instance, the component 114 can be implemented in hardware, firmware, and/or software.

The components 112 and 114 can be discrete components such as an application specific integrated circuit (ASIC), or the components may reflect functionally provided by circuitry within the controller 108 that does not necessarily have a discrete physical form separate from other portions of the controller 108. Although illustrated as components within the controller 108 in FIG. 1, the components 112 and 114 can be external to the controller 108 or can have a number of components located within the controller 108 and a number of components located external to the controller 108.

The memory 110 can include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory 110 as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

Figure 2:
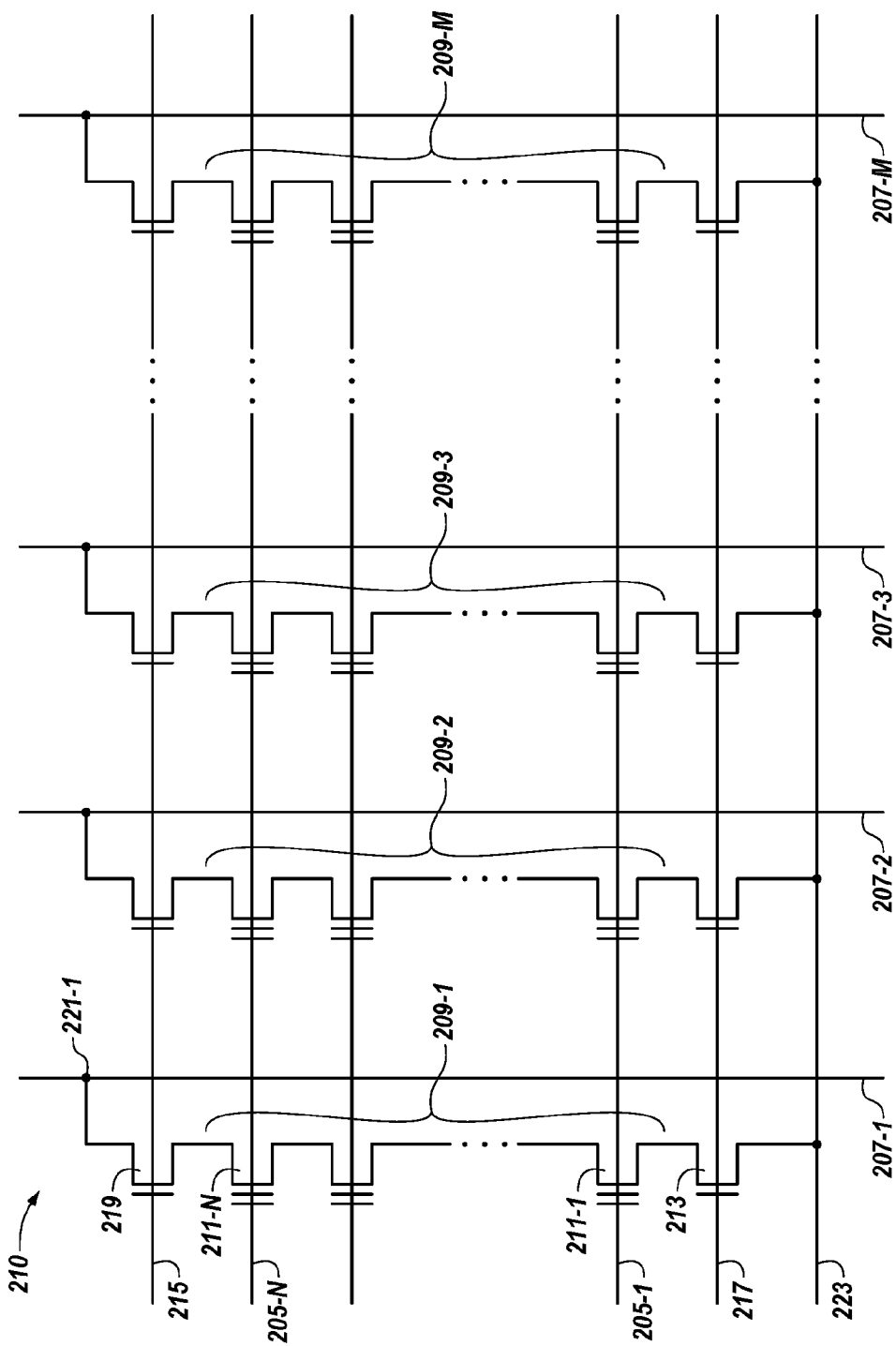
FIG. 2 is a schematic of a portion of a memory comprising an array of memory cells programmable to a plurality of states in accordance with a number of embodiments of the present disclosure.

FIG. 2 is a schematic of a portion of a memory 210 comprising an array of memory cells operable in accordance with a number of embodiments of the present disclosure. The embodiment of FIG. 2 illustrates a NAND architecture non-volatile memory array; however, embodiments described herein are not limited to this example. As shown in FIG. 2, the memory array includes access lines (e.g., word lines 205-1, . . . , 205-N) and data lines (e.g., local bit lines 207-1, 207-2, 207-3, . . . , 207-M). For ease of addressing in the digital environment, the number of word lines 205-1, . . . , 205-N and the number of local bit lines 207-1, 207-2, 207-3, . . . , 207-M can be some power of two (e.g., 256 word lines by 4,096 bit lines).

The memory array includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . , 207-M. The memory cells 211-1, . . . , 211-N of each NAND string 209-1, 209-2, 209-3, . . . , 209-M are coupled in series source to drain between a source select gate (SGS) (e.g., a field-effect transistor (FET) 213) and a drain select gate (SGD) (e.g., FET 219). Each source select gate 213 is configured to selectively couple a respective NAND string to a common source 223 responsive to a signal on source select line 217, while each drain select gate 219 is configured to selectively couple a respective NAND string to a respective bit line responsive to a signal on drain select line 215.

As shown in the embodiment illustrated in FIG. 2, a source of source select gate 213 is coupled to a common source line 223. The drain of source select gate 213 is coupled to the source of the memory cell 211-1 of the corresponding NAND string 209-1. The drain of drain select gate 219 is coupled to bit line 207-1 of the corresponding NAND string 209-1 at drain contact 221-1. The source of drain select gate 219 is coupled to the drain of the last memory cell 211-N (e.g., a floating-gate transistor) of the corresponding NAND string 209-1.

In a number of embodiments, construction of the non-volatile memory cells 211-1, . . . , 211-N includes a source, a drain, a floating gate or other charge storage structure, and a control gate. The memory cells 211-1, . . . , 211-N have their control gates coupled to a word line, 205-1, . . . , 205-N, respectively. A NOR array architecture would be similarly laid out, except that the string of memory cells would be coupled in parallel between the select gates. Furthermore, a NOR architecture can provide for random access to the memory cells in the array (e.g., as opposed to page-based access as with a NAND architecture).

In operation, a number of cells coupled to a selected word line (e.g., 205-1, . . . , 205-N) can be written and/or read together as a group. A group of cells written and/or read together can be referred to as a page of cells (e.g., a physical page) and can store a number of pages of data (e.g., logical pages). For instance, as described further below in association with FIG. 3, the memory cells 211-1, . . . , 211-N can be multilevel cells configured to store more than one digit (e.g., bit) of data per cell. In some such instances, the bits stored in each multilevel cell can correspond to different logical pages of data. For example, a first bit of a 2-bit cell may correspond to a first logical page of data (e.g., a lower page), and a second bit of the 2-bit cell may correspond to a second logical page of data (e.g., an upper page). Cells storing more than two bits per cell may comprise a first bit corresponding to a lower page of data, a second bit corresponding to an upper page of data, and one or more additional bits corresponding to one or more middle pages of data. A group of cells coupled to a particular word line and programmed together to respective data states can be referred to as a target page. A programming operation can include applying a number of program pulses (e.g., 16V-20V) to a selected word line in order to increase the threshold voltage (Vt) of selected cells coupled to that selected word line to a desired voltage level corresponding to a targeted data state.

Read operations can include sensing a voltage and/or current change of a bit line coupled to a selected cell in order to determine the state of the selected cell. The read operation can include precharging a bit line and sensing the discharge when a selected cell begins to conduct. One type of read operation comprises applying a ramping read signal to a selected word line, and another type of read operation comprises applying a plurality of discrete read signals to the selected word line to determine the states of the cells.

Figure 3:
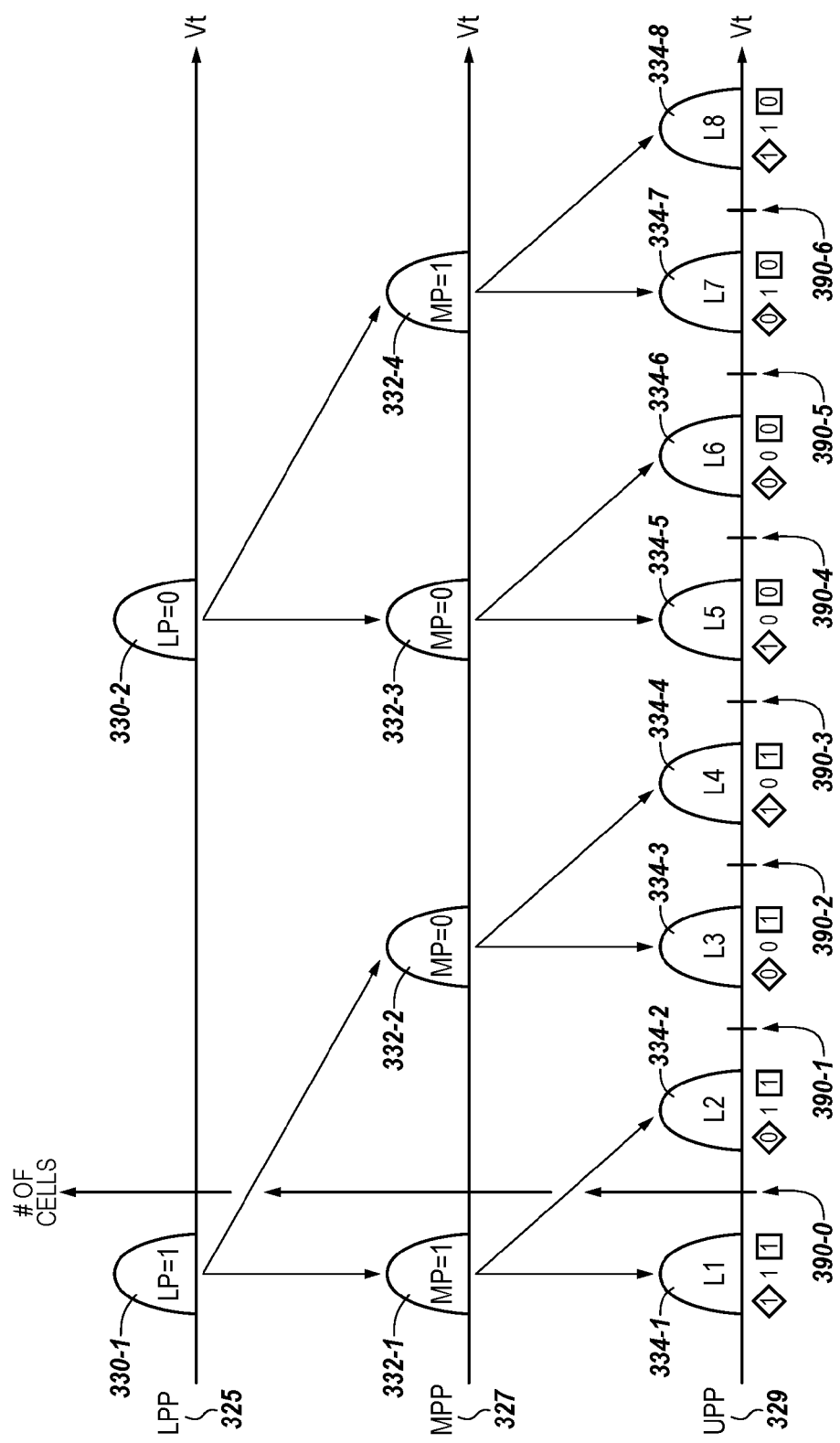
FIG. 3 illustrates a diagram associated with operating memory cells programmable to a plurality of states in accordance with a number of embodiments of the present disclosure

FIG. 3 illustrates a diagram associated with operating memory cells programmable to a plurality of states in accordance with a number of embodiments of the present disclosure. In this example, the memory cells are 3-bit memory cells each being programmable to one of eight data states (e.g., L1 to L8) assigned a different respective 3-bit bit pattern (e.g., 111, 011, 001, 101, 100, 000, 010, and 110). In a number of embodiments, each of the bits in the 3-bit stored bit patterns correspond to a different page of data. For instance, the least significant bit (LSB) (right most bit shown as boxed in FIG. 3) can correspond to a first page of data (e.g., a lower page of data), the middle bit can correspond to a second page of data (e.g., a middle page of data), and the most significant bit (MSB) (left most bit as indicated by a diamond symbol in FIG. 3) can correspond to a third page of data (e.g., an upper page of data).

However, embodiments are not limited to multilevel memory cells storing three bits of data. For instance, a number of embodiments can include memory cells configured to store more or fewer than three bits of data and/or a fractional number of bits of data. Also, as described further herein, the particular encoding of the data states L1 to L8 (e.g., the bit patterns assigned to the data states L1 to L8) is selectable and can be based on various factors.

The diagram shown in FIG. 3 illustrates threshold voltage (Vt) distributions associated with programming memory cells in accordance with a lower page programming (LPP) process 325, a middle page programming (MPP) process 327, and an upper page programming (UPP) process 329. For this example, we assume the memory cells are NAND flash memory cells that are erased prior to having new data programmed thereto.

As part of the LPP process 325, the Vt of the memory cells are adjusted (e.g., via programming pulses applied to a selected word line) to one of two levels represented by Vt distributions 330-1 and 330-2. The voltage levels are represented by Vt distributions, which can reflect a statistical average Vt level of cells programmed to a particular level. In this example, cells whose lower page is to store a bit value of "1" (e.g., LP=1) are programmed to distribution 330-1 during LPP process 325, and cells whose lower page is to store a bit value of "0" (e.g., LP=0) are programmed to distribution 330-2 during LPP process 325.

As part of the MPP process 327, the Vt of the memory cells are adjusted to one of four levels represented by Vt distributions 332-1, 332-2, 332-3, and 332-4. In this example, cells whose middle page is to store a bit value of "1" (e.g., MP=1) are programmed to one of distributions 332-2 and 332-3 during MPP process 327, and cells whose middle page is to store a bit value of "0" (e.g., MP=0) are programmed to one of distributions 332-1 and 332-4 during MPP process 327.

As part of the UPP process 329, the Vt of the memory cells are adjusted to one of eight levels represented by Vt distributions 334-1 to 334-8, which correspond to data states L1 to L8, respectively, with each one of data states L1 to L8 indicating a different 3-bit stored bit pattern. In this example, cells programmed to data state L1 store data "111," cells programmed to data state L2 store data "011," cells programmed to data state L3 store data "001," cells programmed to data state L4 store data "101," cells programmed to data state L5 store data "100," cells programmed to data state L6 store data "000," cells programmed to data state L7 store data "010," and cells programmed to data state L8 store data "110."

The diagram illustrated in FIG. 3 illustrates a number of read voltages 390-0, 390-1, 390-2, 390-3, 390-4, 390-5, and 390-6 (referred to generally as read voltages 390) associated with reading the bits of the three respective stored pages. The read voltages 390 can be applied to a selected word line in association with a read operation that includes respective read strobes (e.g., Vt threshold detections) to determine whether the Vt of the cell being read is above or below that threshold. For example, the quantity of read strobes required to determine (e.g., decode) the bit value (e.g., "1" or "0") of a particular one of the pages (e.g., lower, middle, upper) depends on how many bit transitions (e.g., "1" to "0" and "0" to "1" transitions between neighbor states) occur within the encoding associated with the particular page. For instance, in this example, the encoding is such that the lower page has only one associated bit transition (e.g., the lower page corresponding to each of states L1 to L4 is "0" and the lower page corresponding to each of states L5 to L8 is "1"). Accordingly, a single read strobe can be performed to determine whether the lower page of the cell is a "0" or a "1" (e.g., a single Vt detection operation using read voltage 390-3). Also, in this example, the encoding is such that the middle page has two associated bit transitions (e.g., one transition between states L2 and L3 and one transition between states L6 and L7). Accordingly, two read strobes (e.g., Vt detections) must be performed in order to decode the middle page (e.g., one strobe at read voltage 390-1 and one strobe at read voltage 390-5). Also, in this example, the encoding is such that the upper page has four associated bit transitions (e.g., between states L1 and L2, states L3 and L4, states L5 and L6, and L7 and L8). Accordingly, four read strobes must be performed in order to decode the upper page (e.g., strobes at read voltages 390-0, 390-2, 390-4, and 390-6). As used herein, the quantity of bit transitions corresponding to the respective pages of an encoding (e.g., an N-bit gray code) can be represented with a transition count vector. For instance, in the example shown in FIG. 3, the 3-bit gray code has an associated transition count vector of {4, 2, 1} indicating that the lower page has one transition associated therewith, the middle page has two transitions associated therewith, and the upper page has four transitions associated therewith.

As described above, the particular encoding of memory cell states (e.g., L1 to L8) can affect various characteristics including, but not limited to, the read time associated with reading particular pages and the bit error rate (BER) associated with reading the respective pages. For instance, an increased number of read strobes used to read a particular page can lead to an increased BER as compared to pages read with fewer read strobes. Also, an increased number of read strobes used to read a particular page results in an increased read time as compared to reading pages read with fewer read strobes.

In a number of embodiments of the present disclosure, a particular N-bit gray code from a plurality of determined N-bit gray codes can be selected for encoding a plurality of data states in order to reduce the difference in read time and/or the difference in BER associated with different pages. As one example, for 3-bit cells such as shown in FIG. 3, a 3-bit gray code having a transition count vector of {2, 2, 3} might be selected instead of a transition count vector such as {4, 2, 1} in order to reduce the difference in read time and/or BER between the respective pages.

Figure 4A:
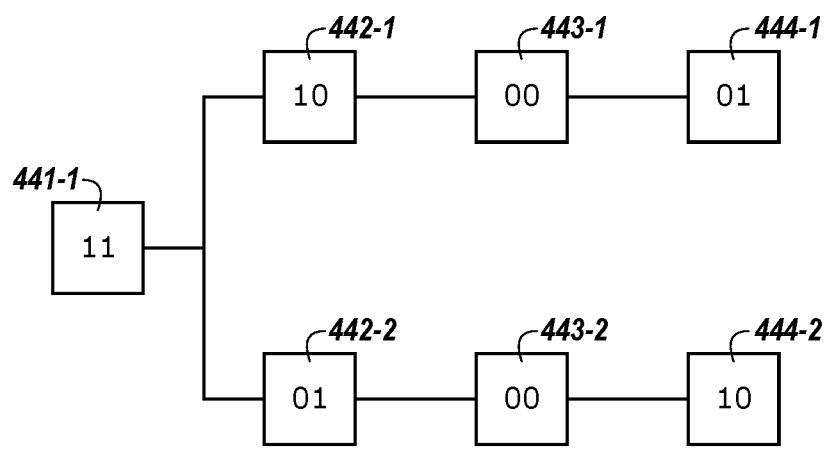
FIGS. 4A and 4B illustrate diagrams associated with generating a plurality of N-bit gray codes in accordance with a number of embodiments of the present disclosure.
Figure 4B:
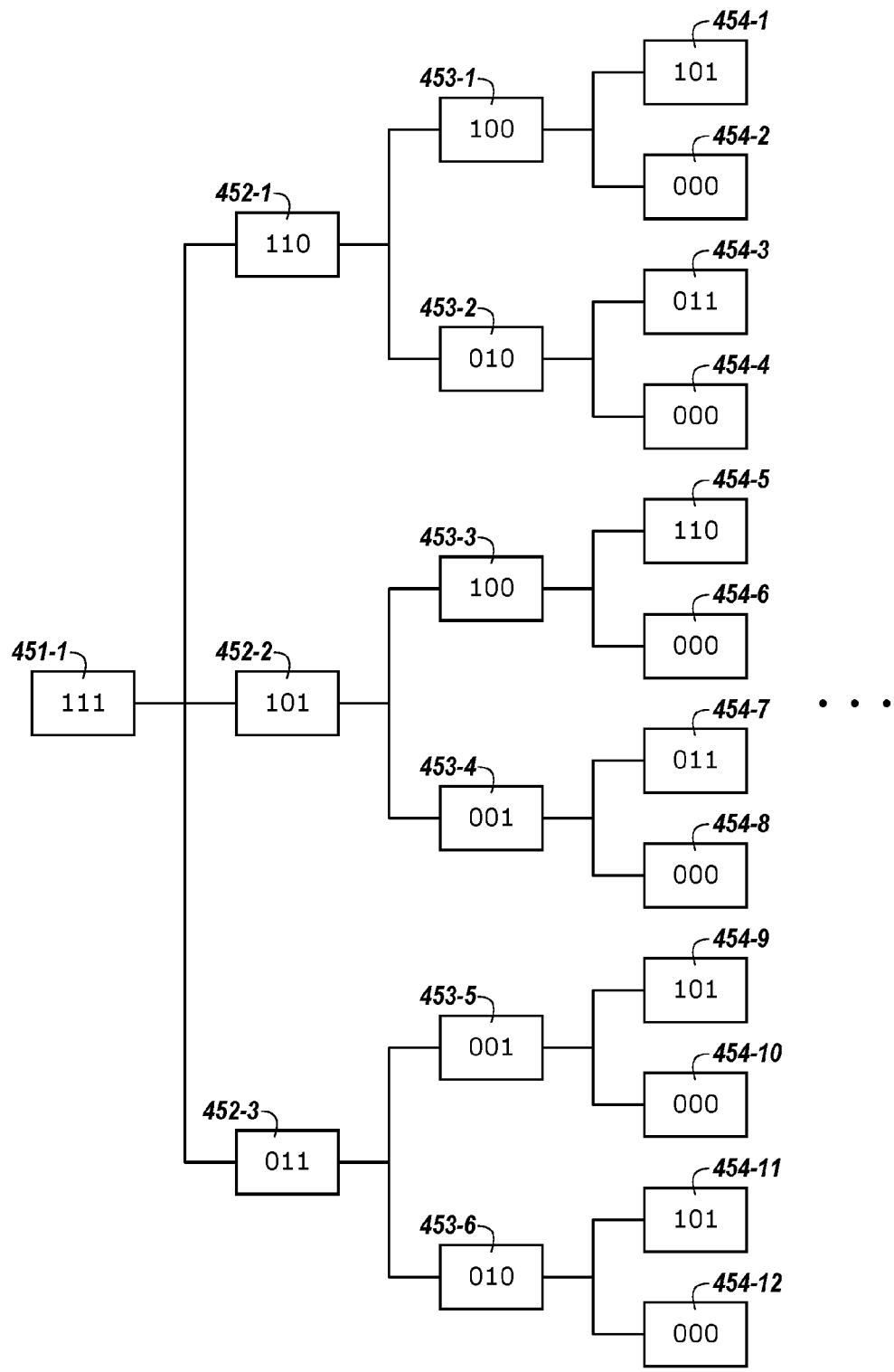

FIGS. 4A and 4B illustrate diagrams associated with generating a plurality of N-bit gray codes in accordance with a number of embodiments of the present disclosure. The diagram shown in FIG. 4A is associated with generating a plurality of 2-bit gray codes (e.g., N=2), and the diagram shown in FIG. 4B is associated with generating a plurality of 3-bit gray codes (e.g., N=3).

A number of embodiments of the present disclosure can include, for a particular value of N, generating all possible N-bit gray codes each comprising X members, and then selecting a particular gray code from among the generated N-bit gray codes with which to encode, for example, X memory cell states. Generating all possible N-bit gray codes can include selecting a particular N-bit member of the X members to serve as a root member (e.g., root node) of a tree data structure indicating all possible N-bit gray codes for a particular value of N. For instance, the branches of the tree data structure are grown from the root member with the quantity of levels of the tree corresponding to, for example, respective data states to be encoded. As an example, the quantity of levels in the tree corresponds to the quantity of data states to be encoded. For instance, a tree with $2^N$ levels can encode up to a total of $2^N$ states; however, the tree can have fewer than $2^N$ levels in order to encode fewer than $2^N$ states. For example, a tree with "X" levels (e.g., for N-bit gray codes each comprising X members) can be used to encode X data states.

With a selected member serving as the root member, the remaining "X−1" members of the respective plurality of N-bit gray codes can be determined by performing X−1 member generation iterations, with each iteration corresponding to a respective level of the tree being generated. For example, each "$i^{th}$" member generation iteration corresponds to a stage of a tree growth process. Accordingly, each $i^{th}$ member generation iteration generates respective $i^{th}$ members of the plurality of N-bit gray codes. For instance, a $1^{st}$ member generation iteration (e.g., i=1) generates respective $1^{st}$ members, a $2^{nd}$ member generation iteration (e.g., i=2) generates respective second members, etc., of the remaining X−1 members (e.g., members in addition to the root member). As described further below, the respective $i^{th}$ members are generated based on $i^{th}-1$ members, with each one of the respective $i^{th}$ members comprising only those eligible neighbor members of a respective one of the $i^{th}-1$ members, and with "i" being a whole number index from 1 to X−1 (e.g., where X is the quantity of members in each of the generated N-bit gray codes). For example, generating the X−1 remaining members of the respective plurality of N-bit gray codes can comprise generating only those members which were not previously determined to be an eligible neighbor member of the respective $i^{th}-1$ member in any prior one of the X−1 member generation iterations.

Turning to FIG. 4A, generating all of the plurality of 2-bit (e.g., N=2) gray codes each comprising four members (e.g., X=4) includes selecting a particular 2-bit member 441-1 to serve as a root member for the plurality of 2-bit gray codes. In this example, the selected root member 441-1 is "11" such that "11" will serve as the root node in a tree data structure used to generate the four 2-bit gray codes. In this example, "11" can correspond to a memory cell erased state; however, embodiments are not so limited.

With reference to FIG. 4A, a first member generation iteration can be performed to determine respective $1^{st}$ members of the remaining three members (e.g., X−1 with X=4) of the 2-bit gray codes (e.g., the three members in addition to the root member). In this example, the first member generation iteration yields members 442-1 (e.g., "10") and 442-2 (e.g., "01"), which correspond to the eligible neighbor members of the root member 441-1 (e.g., "11"). As used herein, an eligible neighbor member refers to child members having values differing from those of their respective parents by only one bit (e.g., such that they satisfy gray code definition) and having values that are not the same as those of any of its own respective preceding parent members.

Accordingly, in this example, the eligible neighbor members of root member 441-1 (e.g., "11") are "10" and "01", which appear as members 442-1 and 442-2, respectively. It is noted that "00" is not an eligible neighbor (e.g., child) of member 441-1 since "00" does not satisfy the gray coding definition because "00" differs from "11" in two bits (e.g., more than one bit). It is also noted that "11" is not an eligible neighbor of member 441-1 because "11" is the value of parent member 441-1. Both "10" and "01" are eligible neighbors of "11" since they satisfy the gray coding constraint and no respective parent has the same value.

A second member generation iteration can be performed to determine respective $2^{nd}$ members of the three remaining members of the 2-bit gray codes. In this example, the second member generation iteration yields member 443-1 (e.g., "00"), which corresponds to the eligible neighbor members of member 442-1 (e.g., "10"), and member 443-2 (e.g., "00"), which corresponds to the eligible neighbor member of member 442-2 (e.g., "01"). As shown in FIG. 4A, the eligible neighbor members of member 442-1 (e.g., "10") is "00", which appears as member 443-1, and the eligible neighbor members of member 442-2 (e.g., "01") is "00", which appears as member 443-2. It is noted that "10" is not an eligible neighbor (e.g., child) of member 442-1 since "10" is the value of member 442-1, and "01" is not an eligible neighbor of member 442-2 since "01" is the value of member 442-2. "01" is not an eligible neighbor of member of 442-1 since "01" differs from "10" in more than one bit, such that "01" does not satisfy the gray coding definition for member 442-1, which has a value of "10". Similarly, "10" is not an eligible neighbor of member of 442-2 since "10" differs from "01" in more than one bit, such that "10" does not satisfy the gray coding definition for member 442-2, which has a value of "01". Although "11" does satisfy the gray coding definition for both members 442-1 and 442-2 because "11" differs from both "10" and "01" in only one bit, "11" is not an eligible neighbor of members 442-1 and 442-2 because the parent of members 442-1 and 442-2 (e.g., member 441-1) has a value of "11".

A third member generation iteration can be performed to determine respective $3^{rd}$ members of the three remaining members of the 2-bit gray codes. In this example, the third (e.g., and final since X−1=3) member generation iteration yields members 444-1 (e.g., "01") and 444-2 (e.g., "10"), which correspond to the eligible neighbors of members 443-1 and 443-2, respectively. It is noted that only "01" is an eligible neighbor (e.g., child) of member 443-1 since "00" is the value of member 443-1, and "10" and "11" are not eligible neighbors of member 443-1 since "10" and "11" are the values of its respective parent members 442-1 and 441-1. Similarly, only "10" is an eligible neighbor of member 443-2 since "00" is the value of member 443-2, and "01" and "11" are not eligible neighbors of member 443-2 since "01" and "11" are the values of its respective parent members 442-2 and 441-1.

Therefore, as illustrated in FIG. 4A, each branch of the tree structure starting at root node 441-1 and ending at a leaf node (e.g., 444-1, 444-2,) will be a 2-bit gray code comprising $2^N$ (e.g., 4) members. For instance, in the example shown in FIG. 4A, subsequent to the three member generation iterations, the tree structure provides two possible 2-bit gray codes each having "11" as a root member. The two generated 2-bit gray codes include a first gray code comprising members 441-1, 442-1, 443-1, and 444-1 (e.g., [11, 10, 00, 01]) and a second gray code comprising members 441-1, 442-2, 443-2, and 444-2 (e.g., [11, 01, 00, 10]).

As described further herein, a number of embodiments can include, subsequent to generating the plurality of (e.g., all) N-bit gray codes, selecting a particular one of the generated N-bit gray codes based on a desired characteristic such as a transition count vector, for example. The particular one of the generated gray codes can be selected to achieve a particular characteristic associated with operating memory cells (e.g., reduced bit error rate associated with reading different pages stored in a same cell, adjusting read time associated with different pages stored in a same cell, etc.).

Turning to FIG. 4B, generating all of the plurality of 3-bit (e.g., N=3) gray codes each comprising X members includes selecting a particular 3-bit member 451-1 to serve as a root member for the plurality of 3-bit gray codes. In this example, the selected root member 451-1 is "111" such that "111" will serve as the root node in the tree data structure used to generate the plurality of 3-bit gray codes. In this example, "111" can correspond to a memory cell erased state; however, embodiments are not so limited.

With reference to FIG. 4B, a first member generation iteration can be performed to determine respective $1^{st}$ members of the respective X−1 members of the respective 3-bit gray codes (e.g., the remaining members in addition to the root member 451-1). In this example, the first member generation iteration yields members 452-1 (e.g., "110"), 452-2 (e.g., "101"), and 452-3 (e.g., "011"), which correspond to the eligible neighbor members of the root member 451-1 (e.g., "111").

In FIG. 4B, the eligible neighbor members of root member 451-1 (e.g., "111") are "110", "101", and "011", which appear as members 452-1, 452-2, and 452-3, respectively. It is noted that "000", "001", "010", and "100" are not eligible neighbors (e.g., children) of member 451-1 since they do not satisfy the gray coding definition because they differ from "111" in more than one bit. It is also noted that "111" is not an eligible neighbor of member 451-1 because "111" is the value of parent member 451-1. Only the values "110", "101", and "011" are eligible neighbors of root member 451-1 (e.g., "111") since they satisfy the gray coding constraint and no respective parent has their same value.

A second member generation iteration can be performed to determine respective $2^{nd}$ members of the remaining X−1 members of the respective 3-bit gray codes. In this example, the second member generation iteration yields members 453-1 (e.g., "100") and 453-2 (e.g., "010"), which are the eligible neighbor members of member 452-1 (e.g., "110"), members 453-3 (e.g., "100") and 453-4 (e.g., "001"), which are the eligible neighbor members of member 452-2 (e.g., "101"), and 453-5 (e.g., "001") and 453-6 (e.g., "010"), which are the eligible neighbor members of member 452-3 (e.g., "011"). It is noted that "110" is not an eligible neighbor (e.g., child) of member 452-1 since "110" is the value of member 452-1, "101" is not an eligible neighbor of member 452-2 since "101" is the value of member 452-2, and "011" is not an eligible neighbor of member 452-3 since "011" is the value of member 452-3. Also, although "111" does satisfy the gray coding definition for each of members 452-1, 452-2, and 452-3 because "111" differs from each of "110", "101", and "011" in only one bit, "111" is not an eligible neighbor of members 452-1, 452-2, and 452-3 because the parent of members 452-1, 452-2, and 452-3 (e.g., member 451-1) has a value of "111".

A third member generation iteration can be performed to determine respective $3^{rd}$ members of the remaining X−1 members for this 3-bit gray code example. In this example, the third member generation iteration (e.g., i=3) yields members 454-1 (e.g., "101") and 454-2 (e.g., "000"), which are the eligible neighbors of member 453-1, 454-3 (e.g., "011") and 454-4 (e.g., "000"), which are the eligible neighbors of member 453-2, 454-5 (e.g., "110") and 454-6 (e.g., "000"), which are the eligible neighbors of member 453-3, 454-7 (e.g., "011") and 454-8 (e.g., "000"), which are the eligible neighbors of member 453-4, 454-9 (e.g., "101") and 454-10 (e.g., "000"), which are the eligible neighbors of member 453-5, and 454-11 (e.g., "101") and 454-12 (e.g., "000"), which are the eligible neighbors of member 453-6.

As noted above, the eligible neighbor (e.g., child) members are those whose values differ from their immediate parent member in only one bit such that they satisfy the gray coding requirement, and whose value is not the same as that of a previous parent member of the branch. For instance, with respect to member 453-1, although its value of "100" differs from value "110" in only one bit, "110" is not an eligible neighbor member of member 453-1 because the parent member of member 453-1 (e.g., member 452-1) has value "110". In accordance with a number of embodiments of the present disclosure, a number of subsequent member generation iterations can be performed (e.g., for i=4 to i=7) to determine a respective number of remaining members of the X−1 remaining members.

Therefore, upon completion of the tree structure shown in FIG. 4B, each branch of the tree structure starting at root node 451-1 and ending at a leaf node (not shown) will be a 3-bit gray code comprising $2^N$ (e.g., 8) members. For instance, in the example shown in FIG. 4B, subsequent to the X−1 member generation iterations (e.g., for X=8), the tree structure provides 18 different 3-bit gray codes each having "111" as a root member. The 18 generated 3-bit gray codes include [111, 110, 100, 101, 001, 000, 010, 011], [111, 101, 100, 110, 010, 011, 001, 000], [111, 110, 100, 101, 001, 011, 010, 000], [111, 101, 100, 110, 010, 000, 001, 011], [111, 110, 010, 011, 001, 000, 100, 101], [111, 011, 010, 000, 001, 101, 100, 110], [111, 101, 100, 000, 001, 011, 010, 110], [111, 011, 001, 000, 010, 110, 100, 101], [111, 110, 100, 000, 010, 011, 001, 101], [111, 101, 001, 011, 010, 000, 100, 110], [111, 011, 010, 110, 100, 101, 001, 000], [111, 110, 010, 011, 001, 101, 100, 000], [111, 101, 001, 000, 100, 110, 010, 011], [111, 110, 010, 000, 100, 101, 001, 011], [111, 011, 001, 101, 100, 110, 010, 000], [111, 101, 001, 011, 010, 110, 100, 000], and [111, 011, 001, 101, 100, 000, 010, 110]. Upon generation of all 18 of the 3-bit gray codes, the 3-bit gray codes can be sorted based on a particular characteristic. For example, the 3-bit gray codes can be sorted according to their respective transition count vectors. For this 3-bit gray code example, the 18 different gray codes each have one of twelve different transition count vectors (e.g., {1, 2, 4}, {1, 3, 3}, {1, 4, 2}, {2, 1, 4}, {2, 2, 3}, {2, 3, 2}, {2, 4, 1}, {3, 1, 3}, {3, 2, 2}, {3, 3, 1}, {4, 1, 2}, and {4, 2, 1}. In accordance with a number of embodiments, a particular one of the generated gray codes can be selected to encode memory cell states in order to achieve, for example, a particular desired operating characteristic. For instance, a gray code having a corresponding transition count vector resulting in a relatively uniform number of strobes per page may be selected with which to encode the memory cell states. As an example, one of the gray codes whose corresponding transition count vector is {2, 2, 3}, {2, 3, 2}, or {3, 2, 2} might be selected since the number of strobes per page would be more uniform as compared to the other transition count vectors, which could result in reduced differences in read time and/or BER between pages, for instance.

Although, the examples described above are for 2-bit and 3-bit gray codes, the gray code generation process described above can be performed for higher order gray codes (e.g., N-bit gray codes in which N is equal to 4, 5, 6, etc.).

Figure 5A:
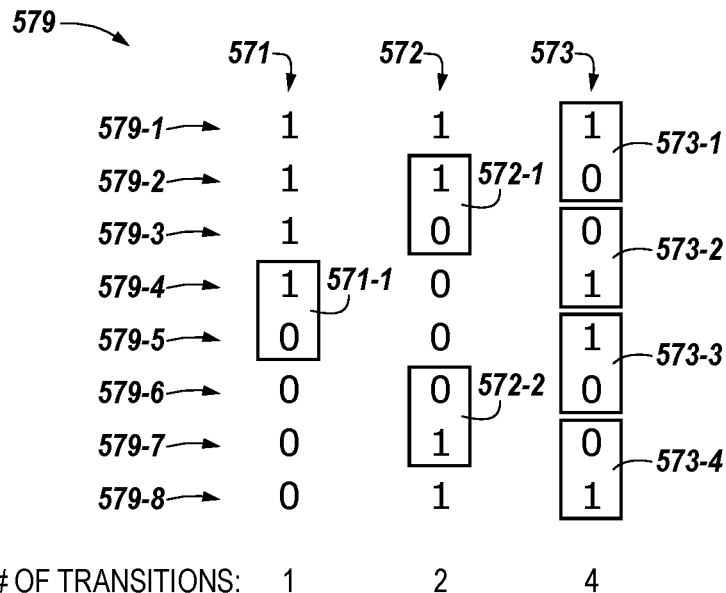
FIGS. 5A and 5B illustrate respective gray codes associated with selecting a particular gray code based on an operating characteristic associated with an array of memory cells in accordance with a number of embodiments of the present disclosure.
Figure 5B:
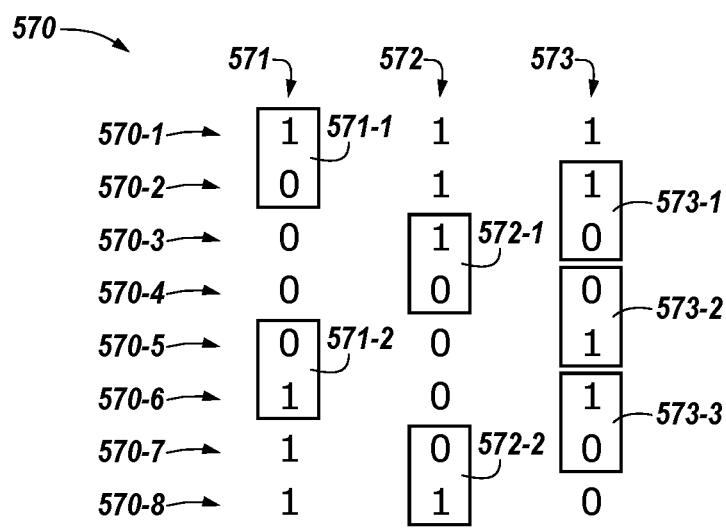

FIGS. 5A and 5B illustrate respective gray codes 579 and 570 associated with selecting a particular gray code based on an operating characteristic associated with an array of memory cells in accordance with a number of embodiments of the present disclosure. The gray codes shown in FIGS. 5A and 5B are 3-bit gray codes that can be generated as described above in association with FIGS. 4A and 4B, for example. The constituent bits (e.g., 571, 572, and 573) of gray codes 579 and 570 can correspond to respective pages of data stored in memory cells. For instance, assuming the gray codes 579 and 570 are assigned to 3-bit memory cells (e.g., memory cells illustrated in FIG. 3), bits 571, 572, and 573 can correspond to an upper page, a middle page, and a lower page, respectively. Although a number of embodiments are not so limited, the gray codes 579 and 570 can comprise eight members (e.g., 579-1, 579-2, 579-3, 579-4, 590-5, 579-6, 579-7, and 579-8 for gray code 579 and 570-1, 570-2, 570-3, 570-4, 570-5, 570-6, 570-7, and 570-8 for gray code 570) each assigned to one of eight data states.

As shown in FIG. 5A, a first bit position 571 of gray code 579 includes a single bit value transition 571-1 (e.g., between members 579-4 and 579-5), a second bit position 572 of the gray code 579 has two bit value transitions 572-1 (e.g., between members 579-2 and 579-3) and 572-2 (e.g., between members 579-6 and 579-7), and a third bit position 573 of the gray code 579 has four bit value transitions 573-1 (e.g., between members 579-1 and 579-2), 573-2 (e.g., between members 579-3 and 579-4), 573-3 (e.g., between member 579-5 and 579-6), and 573-4 (e.g., between members 579-7 and 579-8). As a result, the transition count vector associated with the 3-bit gray code 579 is {1, 2, 4}, which indicates one read strobe is used to read the upper page, two read strobes are used to read the middle page, and four read strobes are used to read the lower page.

As shown in FIG. 5B, a first bit position 571 of gray code 570 includes two bit value transitions 571-1 (e.g., between members 570-1 and 570-2) and 571-2 (e.g., between members 570-5 and 570-6), a second bit position 572 of the gray code 570 has two bit value transitions 572-1 (e.g., between members 570-3 and 570-4) and 572-2 (e.g., between members 570-7 and 570-8), and a third bit position 573 of the gray code 570 has three bit value transitions 573-1 (e.g., between members 570-2 and 570-3), 573-2 (e.g., between members 570-4 and 570-5), and 573-3 (e.g., between member 570-6 and 570-7). As a result, the transition count vector associated with the 3-bit gray code 570 is {2, 2, 3}, which indicates two read strobe are used to read the upper page, two read strobes are used to read the middle page, and three read strobes are used to read the lower page. Accordingly, gray code 570 is representative of a gray code having a corresponding transition count vector whose constituent elements vary by not more than a particular amount. For example, the elements of transition count vector {2, 2, 3} corresponding to 3-bit gray code 570 vary by not more than one transition between elements.

Figure 6:
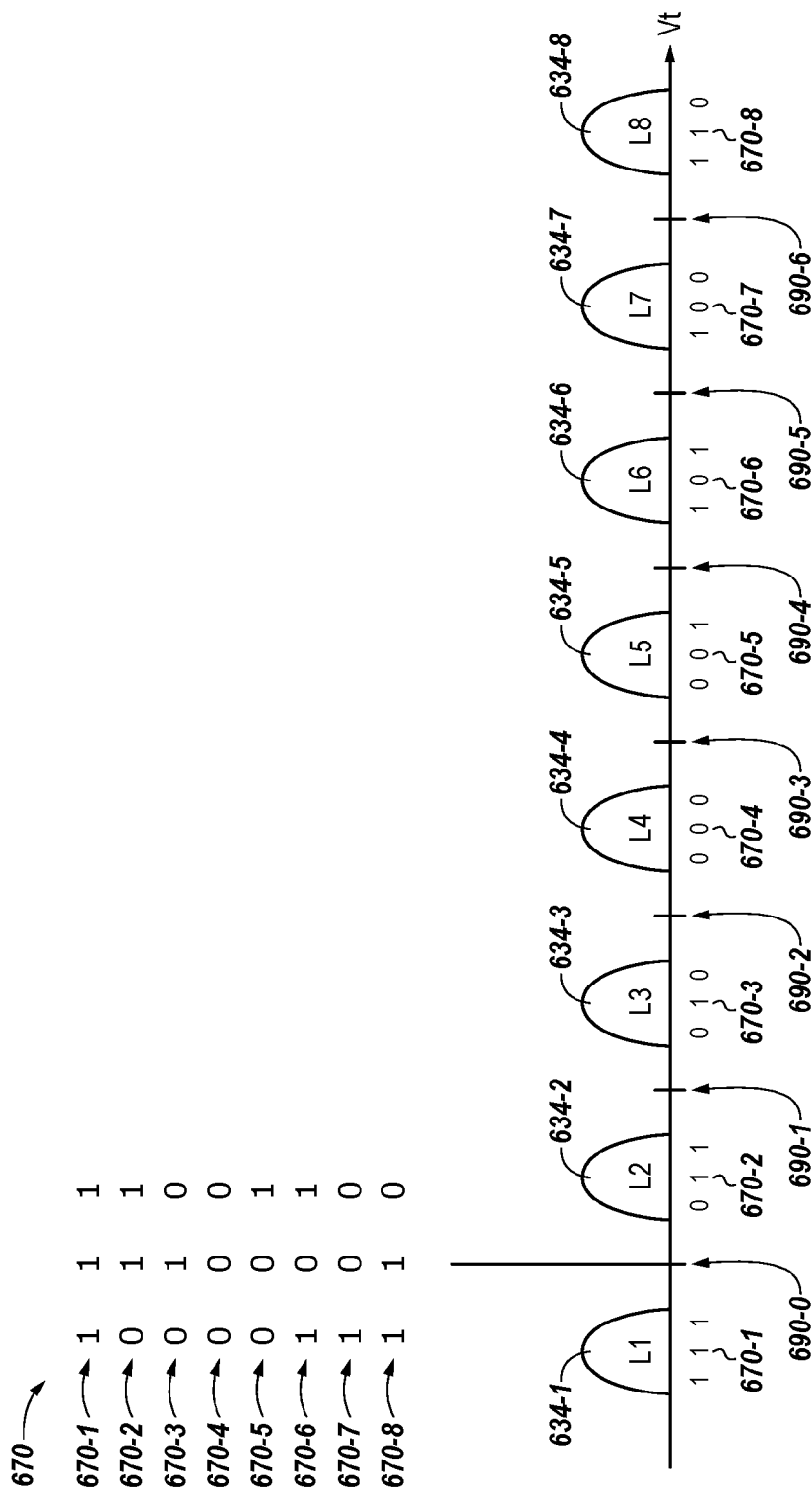
FIG. 6 illustrates a diagram showing data states encoded in accordance with a selected gray code determined in accordance with a number of embodiments of the present disclosure.

FIG. 6 illustrates a diagram showing data states encoded in accordance with a selected gray code determined in accordance with a number of embodiments of the present disclosure. The gray code 670 can be a particular 3-bit gray code selected from a plurality of 3-bit gray codes generated in accordance with a number of embodiments described herein. As an example, the particular gray code 670 can be selected based on a quantity of bit value transitions per page, as described above. As shown in this example, each one of the eight members 670-1, 670-2, 670-3, 670-4, 670-5, 670-6, 670-7, and 670-8 of the gray code 670 are assigned to a respective one of eight data states 634-1 (L1), 634-2 (L2), 634-3 (L3), 634-4 (L4), 634-5 (L5), 634-6 (L6), 634-7 (L7), and 634-8 (L8). As an example, selection of the particular 3-bit gray code may be based on the fact that the constituent elements of its associated transition count vector of {2, 2, 3} vary by not more than one.

As an example, an encoder/decoder (e.g., 114 shown in FIG. 1) can be configured to encode the data states with a selected gray code such as gray code 670 shown in FIG. 6. Also shown in FIG. 6 are the read voltages 690-0, 690-1, 690-2, 690-3, 690-4, 690-5, and 690-6 used to read the three bits stored in memory cells and corresponding to three logical pages of data.

Figure 7:
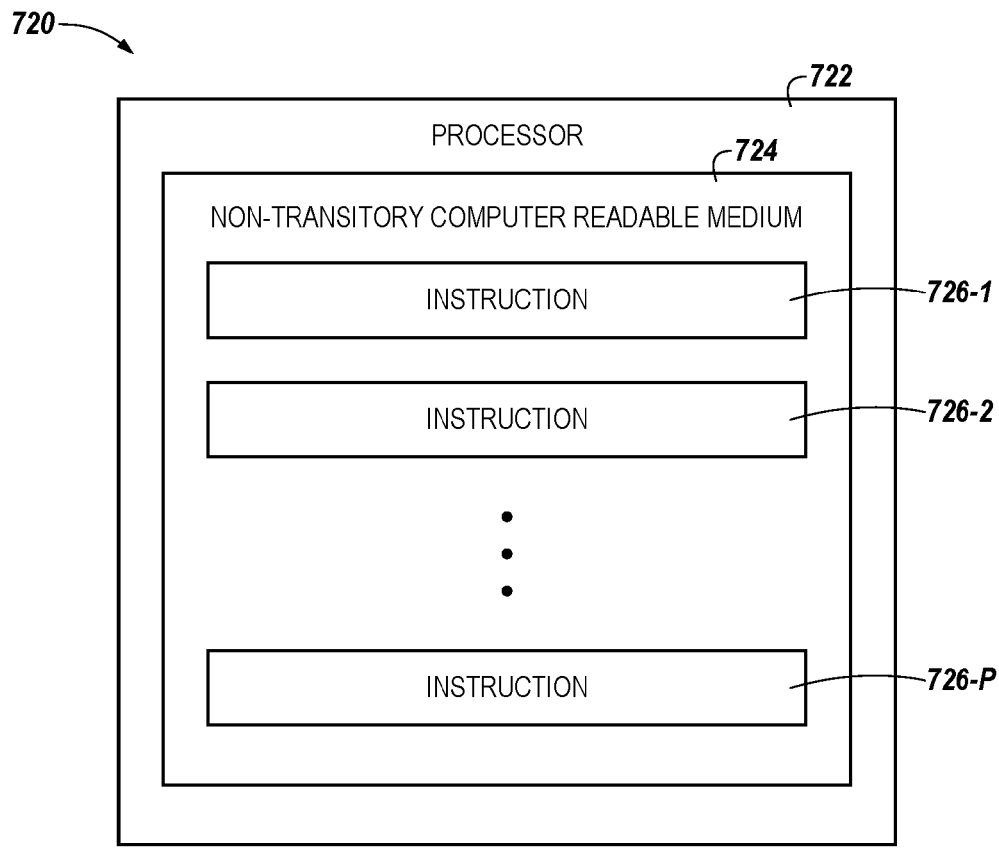
FIG. 7 illustrates a block diagram of an apparatus in the form of a processor configured to execute instructions stored on a non-transitory computer readable medium in accordance with a number of embodiments of the present disclosure.

FIG. 7 is a block diagram of an apparatus in the form of computing system 720 comprising a processor 722 and a non-transitory computer-readable storage medium 724 in accordance with a number of embodiments of the present disclosure. Although the following description may refer to a single processor and/or a single computer readable storage medium, embodiments are applicable to systems with multiple processors and/or multiple computer readable storage mediums. In various such examples, the instructions may be distributed across (e.g., stored) multiple computer readable storage mediums and the instructions may be distributed across (e.g., executed by) multiple processors.

Processor 722 may be a central processing unit (CPU), a semiconductor based microprocessor, and/or other hardware devices suitable for retrieval and execution of instructions stored in computer-readable storage medium 724. Processor 722 may fetch, decode, and execute instructions 726-1, 726-2, . . . , 726-P, or a combination thereof. As an alternative or in addition to retrieving and executing instructions, processor 722 may include at least one electronic circuit that includes electronic components for performing the functionality of instructions 726-1, 726-2, . . . , 726-P, or a combination thereof. As further described above, one or more of the instructions 726-1, 726-2, . . . , 726-P, or a combination thereof, can be executed by a processor such as processor 722 to: select a particular N-bit member as a root member for a plurality of N-bit gray codes such that each of the plurality of N-bit gray codes comprises a same root member; and generate X−1 remaining members of the respective plurality of N-bit gray codes by performing X−1 member generation iterations, wherein each $i^{th}$ iteration of the X−1 member generation iterations generates respective $i^{th}$ members of the plurality of N-bit gray codes based on $i^{th}$−1 members, with each one of the respective $i^{th}$ members comprising only those eligible neighbor members of a respective one of the $i^{th}$−1 members, and with "i" being a whole number index from 1 to X−1.

Computer readable storage medium 724 may be various electronic, magnetic, optical, or other physical storage device that stores executable instructions. Thus, computer readable storage medium 724 may be, for example, Random Access Memory (RAM), an Electrically-Erasable Programmable Read-Only Memory (EEPROM), a storage drive, an optical disc, and the like. Computer readable storage medium 724 may be disposed within system 720, as shown in FIG. 1. In this situation, the executable instructions may be "installed" on the system 720. Additionally and/or alternatively, computer readable storage medium 724 may be a portable, external or remote storage medium, for example, that allows system 720 to download the instructions from the portable/external/remote storage medium. In this situation, the executable instructions may be part of an "installation package".

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   selecting a particular N-bit member as a root member for a plurality of N-bit gray codes each comprising X members such that each of the plurality of N-bit gray codes comprise a same root member; and
   generating X−1 remaining members of the respective plurality of N-bit gray codes by performing X−1 member generation iterations, wherein each $i^{th}$ iteration of the X−1 member generation iterations generates respective $i^{th}$ members of the plurality of N-bit gray codes based on $i^{th}-1$ members, with each one of the respective $i^{th}$ members comprising only those eligible neighbor members of a respective one of the $i^{th}-1$ members, and with "i" being a whole number index from 1 to X−1.

2. The method of claim 1, wherein generating the X−1 remaining members of the respective plurality of N-bit gray codes comprises generating only those members which were not previously determined to be an eligible neighbor member of the respective $i^{th}-1$ member in any prior one of the X−1 member generation iterations.

3. The method of claim 1, wherein the method comprises sorting a group of the generated plurality of N-bit gray codes based on at least one operating characteristic associated with an array of memory cells of a memory device.

4. The method of claim 3, wherein the method comprises selecting a particular N-bit gray code from the sorted group of the generated plurality of N-bit gray codes based on a quantity of bit value transitions per page among the X members, wherein the constituent bits of the X members of the selected N-bit gray code correspond to respective pages of data stored in the array of memory cells.

5. The method of claim 4, wherein the selecting the particular N-bit gray code from the sorted group of the generated plurality of N-bit gray codes based on the quantity of bit value transitions per page among the X members comprises comparing a plurality of transition count vectors of the sorted group of the generated plurality of N-bit gray codes such that a particular N-bit gray code is selected among those of the generated plurality of N-bit gray codes having a corresponding transition count vector whose constituent elements vary by not more than a particular amount.

6. The method of claim 5, wherein the selected N-bit gray code comprises a corresponding transition count vector whose constituent elements vary by not more than one such that the quantity of read strobes used to determine bit values of the respective pages varies by not more than one.

7. The method of claim 3, wherein the method comprises selecting a particular N-bit gray code from the sorted group of the generated plurality of N-bit gray codes to encode a plurality of (X) states to which the array of memory cells are programmable.

8. The method of claim 3, wherein the method comprises encoding an erased state of the memory device such that the root member for the N-bit gray code corresponds to the erased state.

9. An apparatus, comprising:
   an array of memory cells;
   wherein the memory cells are programmable to a plurality of (X) states encoded in accordance with a selected N-bit gray code; and
   wherein the selected N-bit gray code is selected from a generated plurality of N-bit gray codes each comprising X members, the generated plurality of N-bit gray codes comprising:
      a particular N-bit member selected to serve as a root member for the plurality of N-bit gray codes such that each of the plurality of N-bit gray codes comprise a same root member; and
      wherein the X−1 remaining members of the respective plurality of N-bit gray codes are obtained via performance of X−1 member generation iterations, wherein each $i^{th}$ iteration of the X−1 member generation iterations generates $i^{th}$ members of the plurality of N-bit gray codes based on $i^{th}-1$ members, with each one of the respective $i^{th}$ members comprising only those eligible neighbor members of a respective one of the $i^{th}-1$ members, and with "i" being a whole number index from 1 to X−1.

10. The apparatus of claim 9, wherein the selected N-bit gray code is selected from a sorted group of the generated plurality of N-bit gray codes, wherein the sorted group is sorted based on at least one operating characteristic associated with the array.

11. The apparatus of claim 9, wherein the constituent bits of the X members of the selected N-bit gray code correspond to respective pages of data, with the selected N-bit gray code being selected based on a quantity of bit value transitions per page among the X members.

12. The apparatus of claim 9, wherein the bit positions within the X members of the generated plurality of N-bit gray codes correspond to respective pages of data, and wherein a quantity of bit value transitions per page within each of the generated plurality of N-bit gray codes comprise elements of a transition count vector, and wherein the selected N-bit gray code is selected based on a comparison of the respective transition count vectors.

13. The apparatus of claim 12, wherein the elements of the transition count vector indicate a quantity of read strobes used to determine bit values of respective pages to which the elements correspond, and wherein the selected N-bit gray code is selected from among those of the generated plurality of N-bit gray codes having a corresponding transition count vector whose constituent elements vary by not more than a particular amount.

14. The apparatus of claim 13, wherein the selected N-bit gray code is selected from among those of the generated plurality of N-bit gray codes having a corresponding transition count vector whose constituent elements vary by not more than one such that the quantity of read strobes used to determine bit values of the respective pages varies by not more than one.

15. The apparatus of claim 9, wherein those eligible neighbor members of a respective one of the $i^{th}-1$ members comprise only those members which were not previously determined to be an eligible neighbor member of the respective $i^{th}-1$ member in any prior one of the X−1 member generation iterations.

16. The apparatus of claim 9, wherein the apparatus comprises a controller configured to program the array of memory cells in accordance with the selected N-bit gray code.

17. The apparatus of claim 9, wherein the root member for the N-bit gray codes corresponds to an erased state.

18. An apparatus, comprising:
  an array of memory cells each configured to store data corresponding to multiple pages;
  a controller configured to read a particular page of data stored in the array, wherein a quantity of read strobes used to read the particular page depends on an encoding assigned to states to which the memory cells are programmable;
  wherein the memory cells are programmable to a plurality of (X) states; and
  wherein the encoding assigned to states to which the memory cells are programmable is a selected N-bit gray code with each of the respective N bits corresponding to a different page of data; and
  wherein the selected N-bit gray code is selected from a generated plurality of N-bit gray codes each comprising X members, the generated plurality of N-bit gray codes comprising:
    a particular N-bit member selected to serve as a root member for the plurality of N-bit gray codes such that each of the plurality of N-bit gray codes comprise a same root member; and
    wherein the X−1 remaining members of the respective plurality of N-bit gray codes are obtained via performance of X−1 member generation iterations, wherein each $i^{th}$ iteration of the X−1 member generation iterations generates $i^{th}$ members of the plurality of N-bit gray codes based on $i^{th}-1$ members, with each one of the respective $i^{th}$ members comprising only those eligible neighbor members of a respective one of the $i^{th}-1$ members, and with "i" being a whole number index from 1 to X−1.

19. The apparatus of claim 18, wherein the selected N-bit gray code is selected from a sorted group of the generated plurality of N-bit gray codes, wherein the sorted group is sorted based on at least one operating characteristic associated with the array.

20. The apparatus of claim 18, wherein the constituent bits of the X members of the selected N-bit gray code correspond to respective pages of data, with the selected N-bit gray code being selected based on a quantity of bit value transitions per page among the X members.

21. The apparatus of claim 18, wherein a quantity of bit value transitions per page within each of the selected N-bit gray code comprises elements of a transition count vector, and wherein the selected N-bit gray code is selected based on a comparison of the respective transition count vectors.

22. The apparatus of claim 21, wherein the elements of the transition count vector indicate the quantity of read strobes, and wherein the selected N-bit gray code is selected from among those of the generated plurality of N-bit gray codes having a corresponding transition count vector whose constituent elements vary by not more than a particular amount.

23. The apparatus of claim 22, wherein the selected N-bit gray code is selected from among those of the generated plurality of N-bit gray codes having a corresponding transition count vector whose constituent elements vary by not more than one such that the quantity of read strobes used to determine bit values of the respective pages varies by not more than one.

24. The apparatus of claim 18, wherein those eligible neighbor members of a respective one of the $i^{th}-1$ members comprise only those members which were not previously determined to be an eligible neighbor member of the respective $i^{th}-1$ member in any prior one of the X−1 member generation iterations.

25. The apparatus of claim 18, wherein the apparatus comprises a controller configured to program the array of memory cells in accordance with the selected N-bit gray code.

26. The apparatus of claim 18, wherein the root member for the N-bit gray codes corresponds to an erased state.

27. A non-transitory computer-readable storage medium containing instructions that when executed cause a processor to:
  select a particular N-bit member as a root member for a plurality of N-bit gray codes such that each of the plurality of N-bit gray codes comprises a same root member; and
  generate X−1 remaining members of the respective plurality of N-bit gray codes by performing X−1 member generation iterations, wherein each $i^{th}$ iteration of the X−1 member generation iterations generates respective $i^{th}$ members of the plurality of N-bit gray codes based on $i^{th}-1$ members, with each one of the respective $i^{th}$ members comprising only those eligible neighbor members of a respective one of the $i^{th}-1$ members, and with "i" being a whole number index from 1 to X−1.

28. The non-transitory computer-readable storage medium of claim 27, further comprising instructions to sort a group of the generated plurality of N-bit gray codes based on at least one operating characteristic associated with an array of memory cells of a memory device.

29. The non-transitory computer-readable storage medium of claim 28, wherein sorting the group of the generated plurality of N-bit gray codes based on at least one operating characteristic associated with the array of memory cells of the memory device comprises instructions to select a particular N-bit gray code from among those of the generated plurality of N-bit gray codes having a corresponding transition count vector whose constituent elements vary by not more than a particular amount.

30. The non-transitory computer-readable storage medium of claim 27, further comprising instructions to generate only those members which were not previously determined to be an eligible neighbor member of the respective $i^{th}-1$ member in any prior one of the X−1 member generation iterations.

* * * * *